US011804525B2

(12) United States Patent
Bowers et al.

(10) Patent No.: US 11,804,525 B2
(45) Date of Patent: Oct. 31, 2023

(54) DISLOCATION GLIDE SUPPRESSION FOR MISFIT DISLOCATION FREE HETEROEPITAXY

(71) Applicant: THE REGENTS OF THE UNIVERSITY OF CALIFORNIA, Oakland, CA (US)

(72) Inventors: John Bowers, Santa Barbara, CA (US); Justin Norman, Goleta, CA (US); Kunal Mukherjee, Goleta, CA (US); Jennifer Selvidge, Goleta, CA (US); Eamonn Hughes, Santa Barbara, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 17/066,876

(22) Filed: Oct. 9, 2020

(65) Prior Publication Data
US 2021/0111087 A1  Apr. 15, 2021

Related U.S. Application Data

(60) Provisional application No. 62/926,846, filed on Oct. 28, 2019, provisional application No. 62/913,975, filed on Oct. 11, 2019.

(51) Int. Cl.
*H01L 29/32* (2006.01)
*H01L 29/205* (2006.01)
*H01L 21/02* (2006.01)

(52) U.S. Cl.
CPC ............ *H01L 29/32* (2013.01); *H01L 29/205* (2013.01); *H01L 21/02381* (2013.01); *H01L 21/02463* (2013.01); *H01L 21/02505* (2013.01); *H01L 21/02546* (2013.01)

(58) Field of Classification Search
CPC ....... H01L 21/02381; H01L 21/02455–02466; H01L 21/02505; H01L 21/02538–02549; H01L 23/298; H01L 23/3157; H01L 29/205; H01L 29/32
See application file for complete search history.

(56) References Cited

U.S. PATENT DOCUMENTS

| 6,566,688 | B1* | 5/2003 | Zhang ................. H01S 5/34306 257/85 |
| 8,338,859 | B2* | 12/2012 | Kokawa .............. H01L 29/7783 257/190 |
| 2005/0037526 | A1* | 2/2005 | Kamiyama ........... C30B 29/406 257/E31.022 |
| 2015/0177458 | A1* | 6/2015 | Bowers ................. G02B 6/131 438/455 |

OTHER PUBLICATIONS

Selvidge et al., "Non-radiative recombination at dislocations in InAs quantum dots grown on silicon", Appl. Phys. Lett. 115, 131102 (2019), Published Online: Sep. 25, 2019. (Year: 2019).*

* cited by examiner

*Primary Examiner* — Andres Munoz
(74) *Attorney, Agent, or Firm* — Billion & Armitage

(57) ABSTRACT

An epitaxial structure includes a semiconductor substrate, a dislocation blocking layer; and one or more active layers.

17 Claims, 5 Drawing Sheets

DISLOCATION GLIDE SUPPRESSION FOR MISFIT DISLOCATION FREE HETEROEPITAXY

CROSS-REFERENCE TO RELATED APPLICATIONS

This application claims the benefit of and priority to U.S. provisional application 62/913,975, titled "DISLOCATION GLIDE SUPPRESSION FOR MISFIT DISLOCATION FREE HETEROEPITAXY", filed Oct. 11, 2019, and to U.S. provisional application 62/926,846, titled "DISLOCATION GLIDE SUPPRESSION FOR MISFIT DISLOCATION FREE HETEROEPITAXY", filed Oct. 28, 2019, the contents of each are incorporated by reference herein.

STATEMENT OF GOVERNMENT RIGHTS

This invention was made with Government support under Grant (or Contract) No. DE-AR0000672, awarded by the U.S. Department of Energy (DoE) and Advanced Research Projects Agency-Energy (ARPA-E). The Government has certain rights in this invention.

BACKGROUND

Semiconductors are grown at elevated temperatures, and different semiconductors (most notably III-V type semiconductors and Silicon (Si)) have different thermal expansion coefficients. As a result, fabricating (i.e., growing) semiconductors of one type on a semiconductor of another type—such as the fabrication of commercially desirable III-Vs grown on Si—causes stress to build in the semiconductor material as it cools down from growth. This stress can induce glide processes that form misfit (in the growth plane) dislocations. Misfit dislocations dramatically hinder the performance of optical and electronic devices. It would be beneficial to develop structures and processes that minimize the formation of these misfit dislocations.

SUMMARY

According to one aspect, an epitaxial structure includes a semiconductor substrate, a dislocation blocking layer; and one or more active layers.

According to another aspect, an epitaxial structure includes a semiconductor substrate, a bottom blocking region and one or more active layers. The bottom blocking region is located between the semiconductor substrate and the one or more active layers and wherein a lattice constant of the semiconductor substrate is different than a lattice constant of the one or more active layers.

DETAILED DESCRIPTION

Figure 1A:
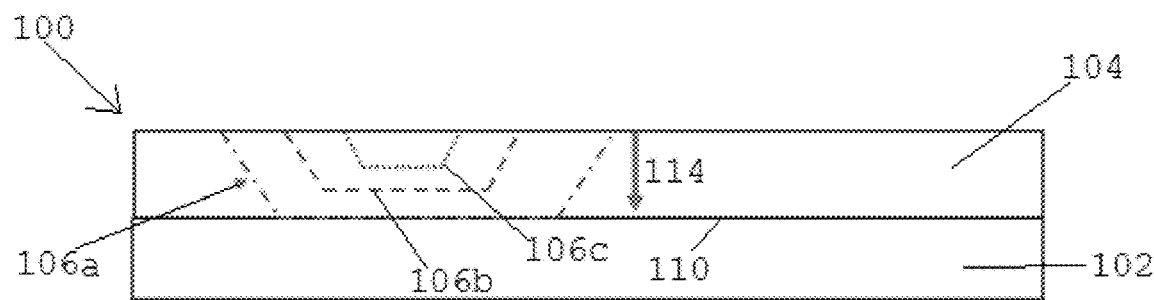
FIG. 1a-1c are cross-sectional schematic diagrams illustrating formation of misfit dislocations due to glide.
Figure 1B:
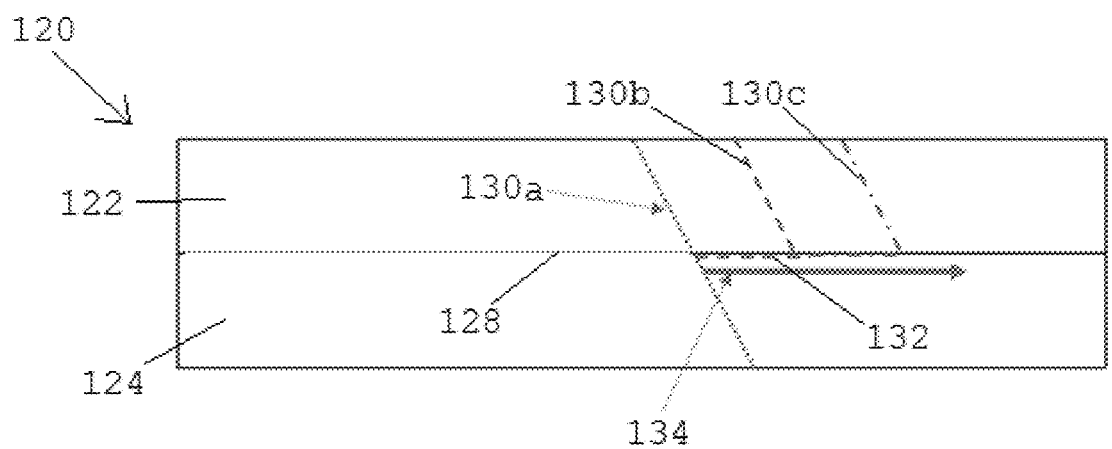
Figure 1C:
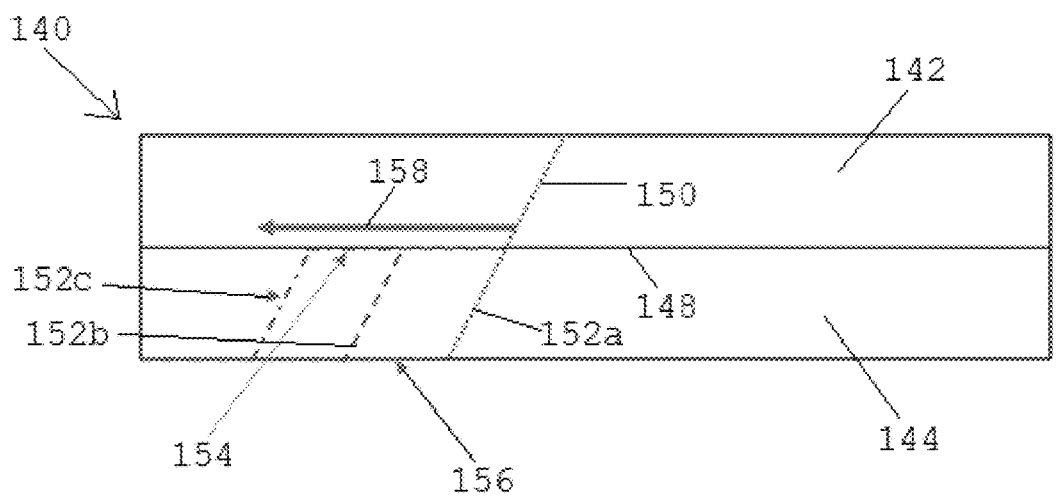

Referring now to FIGS. 1a-1c, schematic diagrams of heteroepitaxial semiconductor structures 100, 120, 140 that illustrate typically observed glide processes in epitaxial semiconductors. With respect to FIG. 1a, the semiconductor structure utilizes mismatched materials to fabricate semiconductor layers 102 and 104, wherein the mismatch refers to the bulk lattice constant in the materials prior to growth. A dislocation loop is illustrated at three instances in time (illustrated as threading dislocation 106a, 106b, and 106c) propagating downward (in the direction indicated by arrow 114) during cooldown toward the interface of the semiconductor layers 102 and 104. Although the misfit dislocation itself extends laterally (i.e., horizontally), the location of the misfit dislocation is described as moving up or down within the plurality of layers. For example, arsenides, phosphides, antimonides on silicon, compressive strain is relaxed during growth and tensile strain builds during cooldown. Other substrates besides silicon, such as sapphire, glass, quartz, SiC, GaAs, CdTe, are also of interest, although the sign of strain and change during cooldown may be different. Also, nitrides are also of interest and would benefit from this idea, depending on the sign of strain and CTE difference between the nitride and substrate. This technique can be applied to any film and substrate combination in which the following two criteria are met: threading dislocations are glissile (able to glide) within the system and there is a stress inversion in the film (tensile to compressive or compressive to tensile) from growth temperatures to device operating temperatures due to lattice and CTE mismatches. Also, strained, alloyed, or nanostructured layers such as quantum wells or layers of quantum dots utilized in optical devices provide potential pinning points for dislocations. A threading dislocation incident on the pinning point of the strained layer will cause long misfit dislocations to form within the device layer as existing thread segments above and/or below the pinning point that glide along the interface. The misfit locations, because they extend along the plane of the layer, may affect the performance of the device (particularly the active regions of optical devices) more than threading dislocations. In the example provided in FIG. 1a, during post-growth cooldown, dislocations loop 106c propagates/glides down to the strained interface 110 between the semiconductor layer 104 and the semiconductor substrate 102. This type of dislocation loop may occur in stacked materials with or without a mismatch in the bulk crystal lattice constant at room temperature. In some embodiments, the threading dislocations are in response to either tensile strain or compressive strain and can be characterized as either tensile or compressive in nature. Likewise, FIGS. 1b and 1c illustrates heteroepitaxial stacks 120, 140 where there is a mismatch in the bulk lattice constant prior to growth between respective epitaxial semiconductor layers 122, 142 and 124, 144. With respect to FIG. 1b, the interface 128 between heteroepitaxial semiconductor layers 122 and 124 is a strained interface where 124 is strained relative to the overall epitaxial structure—for example 124 could represent a quantum well or quantum dot layer. As shown in FIG. 1b, an existing threading dislocation 130 from an underlying interface—for example a III-V/Si interface—becomes pinned in 124, and propagates/glides to the right (in the direction indicated by arrow 132) over time as indicated by lines 130*a*, 130*b*, and 130*c* in layer 122 due to the built up strain during cooldown. The threading dislocation 130 results in formation of a misfit dislocation 132 at the stained interface between epitaxial semiconductor layers 122 and 124 that propagates/glides to the right in conjunction with the glide of threading dislocation 130. With respect to FIG. 1*c*, epitaxial layers 142 and 144. In this embodiment, a relaxed interface 156 between epitaxial layer 144 and a lower layer (not shown) is the source of a threading dislocation 152. In this embodiment 142 represents a strained layer—for example a quantum well or quantum dot layer—which pins the threading dislocation 150. In this embodiment, the threading dislocation 152 propagates/glides to the left (in the direction indicated by arrow 158) over time as indicated by lines 152*a*, 152*b*, and 152*c*. The threading dislocation 152 results in formation of a misfit dislocation 154 at the strained interface 148 between epitaxial layers 142 and 144 that also propagates/glides to the left along with threading dislocation 152. As described above, the formation of misfit dislocations 132, 154 at the strained interfaces of epitaxial layers—typically active layers in optical devices—results in a significant degradation of performance of the device.

Figure 2:
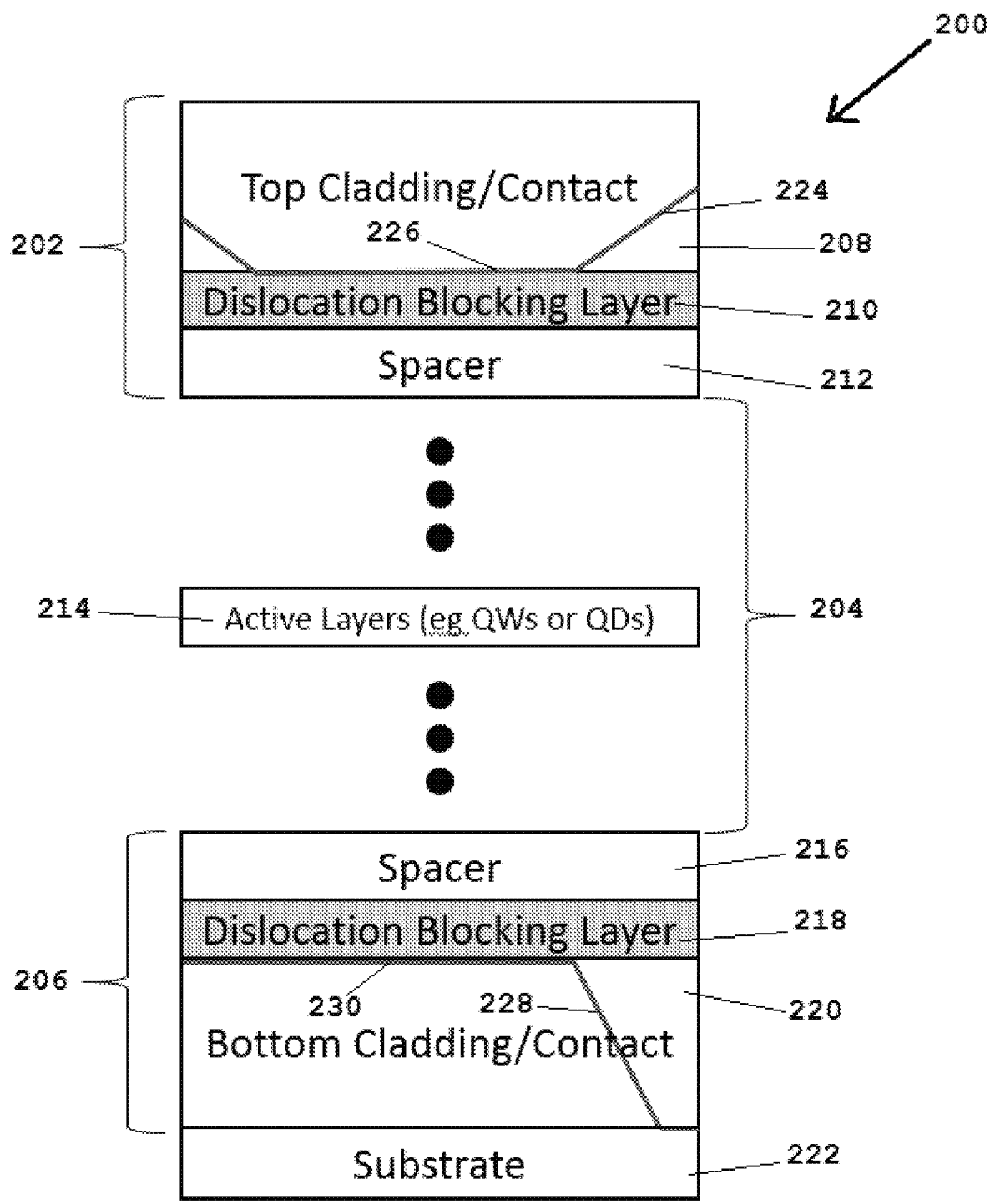
FIG. 2 is a schematic of the epitaxial structure utilizing a blocking layer to reduce misfit dislocations in the laser active region according to some embodiments.

FIG. 2 is a cross-sectional schematic view of a heteroepitaxial semiconductor 200 that includes top blocking region 202, active region 204, bottom blocking region 206, and substrate 222. In some embodiments, top blocking region 202 may include any combination of doped or undoped regions; active region 204 includes a plurality of active layers; and bottom blocking region 206 includes any combination of doped or undoped regions. In some embodiments, the heteroepitaxial semiconductor 200 is a quantum dot laser fabricated on a silicon substrate 222, wherein the silicon substrate 222 has a lattice constant having a coefficient of thermal expansion (CTE) mismatch relative to the above layers. For example, in one embodiment the semiconductor substrate 222 is a silicon substrate and the epitaxial layers include one or more of Gallium Arsenide (GaAs), Aluminum Gallium Arsenide (AlGaAs), Indium Gallium Arsenide (InGaAs), Indium Aluminum Arsenide (InAlAs), and Indium Arsenide (InAs). For example, quantum dot/quantum well layers may utilize InAs, the blocking layers may utilize InGaAs and/or InAlAs, and the remaining layers may utilize some combination of GaAs and AlGaAs.

In the embodiment shown in FIG. 2, top blocking region 202 includes top cladding/contact layer 208, dislocation blocking layer 210 and spacer 212. Likewise, bottom blocking region 206 includes spacer 216, dislocation blocking layer 218, and bottom cladding/contact layer 220. In the embodiment shown in FIG. 2, a threading dislocation 224 extends through the top cladding/contact layer 208 and feeds a misfit dislocation 226 at the interface of the top cladding/contact layer 208 and dislocation blocking layer 210. As a result, the misfit dislocation 226 is captured within the dislocation blocking layer 210 rather than being allowed to glide into the active layers 214. In some embodiments, the presence of threading dislocations 224 and 228 within the active layers 214 are acceptable so long as misfit dislocations do not extend into the active region 204.

In some embodiments, the dislocation blocking layer 210 is defined by a plurality of criteria, including thickness, strain, composition, band-gap and proximity to the active layer, selected to capture misfit dislocations. In addition, the dislocation blocking layer 210 should provide pinning points (shown more specifically with respect to FIGS. 3*a* and 3*b*) that operate to pin the threading dislocations within the dislocation blocking layer 210. In some embodiments, the thickness is selected within a particular range. That is, if the thickness of the dislocation blocking layer 210 is too narrow or thin, misfit dislocations may be able to glide or tunnel through the dislocation blocking layer 210 or the threading dislocation is not sufficiently pinned. Thus, the dislocation blocking layer has a thickness selected to capture misfit dislocations and also provide adequate pinning to the threading dislocation. Likewise, if the thickness of the dislocation blocking layer is too great, the compressive and/or tensile strain may exceed a threshold and create or nucleate additional misfit dislocations. To enhance the likelihood of each thread encountering a pinning point, some embodiments may include multiple blocking layers. The pinning regions in the blocking layer (for example alloy or thickness fluctuations) could be statistically distributed throughout the layer, and in some cases, regions of uniformity may form such that there is no pinning in that region. When two or more blocking layers are placed together, the likelihood of one areal region not containing a pinning point diminishes, since it is unlikely that large regions of uniformity will randomly form in alignment between layers. Such blocking layers should be below the critical thickness for forming new dislocations and be in close enough proximity to each other that a thread pinned in a lower blocking layer cannot form a misfit in the next upper blocking layer. The number of blocking layers should be chosen such that the cumulative strain of the blocking layers and active layers does not exceed critical thickness for the introduction of new dislocations. In some embodiments, the strain associated with the composition is selected based on a desired type and within a desired range. That is, the type of strain provided by the dislocation blocking layer 210—compressive or tensile—is selected based on the type of strain associated with the active layers, wherein the strain of the dislocation blocking layer 210 is selected to be opposite that of the active layers. For example, for embodiment in which device includes a III-V semiconductor layer fabricated on a silicon substrate, the type of strain in the III-V layer is typically tensile, in which the dislocation blocking layer 210 will be compressive. In addition, the magnitude of the strain is selected within a desired range. As with the thickness, if the strain associated with the composition is too small, the misfit dislocation may be capable of tunneling or moving through the dislocation blocking layer 210. Likewise, if the strain associated with the composition is too great, the dislocation blocking layer 210 may nucleate additional misfit dislocations. In some embodiments, the strain associated with the composition of the dislocation blocking layer 210 is related to the overall thickness of the dislocation blocking layer 210. In addition, the composition of the blocking layer 210 may be selected to include alloys, precipitates, or nanostructures such as quantum dots that promote hardening to provide pinning points for the intersecting threading dislocations.

In addition, the dislocation blocking layer 210 is defined by a bandgap, band offset and lattice constant. In some embodiments the bandgap of the dislocation blocking layer 210 is dependent on the type of device being fabricated. For example, in some embodiments the bandgap should not be so wide as to create a barrier to electrical current injection, but should not be so narrow as to cause parasitic recombination (i.e., creating light) outside of the active region and similarly do not want the bandgap to be so narrow as to trap carriers in the vicinity of the blocked misfit dislocations causing them to grow through dislocation climb processes. The lattice constant should not be so dissimilar as to cause additional threading or misfit dislocations. The blocking layers need not be identical to each other in composition or thickness and may be composed of uniform layers, variable composition layers, or layers with inclusions (for example quantum dots or voids). The bandgap of the blocking layer may be larger or smaller than the surrounding material and may exhibit any degree of quantum confinement (for example bulk, well, wire, or dot).

In addition, the dislocation blocking layer 210 is defined by a proximity to the active layer 204 determined by the thickness of the spacer layer 212. If the dislocation blocking layer 210 is too close to the active layer 204 (i.e., the spacer layer 212 is too narrow), then the misfit dislocations formed at the interface of the dislocation blocking layer 210 may affect the operation of the active layer 204. However, if the dislocation blocking layer 210 is located too far from the active layer 204 (i.e., spacer layer 212 is too wide) may result in additional misfit dislocations in the active layer formed by bowing out of the threading dislocation. Similarly, dislocation blocking layer 218 is defined by the same plurality of criteria, including thickness, strain, composition, band-gap and proximity to the active layer.

In the embodiment shown in FIG. 2, dislocation blocking layer 210 captures misfit dislocation 226 at the interface between dislocation blocking layer 210 and top cladding/contact layer 226, thereby preventing the misfit dislocation from gliding down into the active layer region 204. Likewise, dislocation blocking layer 218 captures misfit dislocation 230 at the interface between dislocation blocking layer 218 and bottom cladding/contact layer 220, thereby preventing the misfit dislocation from gliding upward into the active layer region 204. As a result, active layer region 204, comprised of a plurality of active layers 214 (e.g., Quantum wells (QWs) or Quantum Dots (QD)), is relatively free of misfit dislocations.

Figures 3A, 3B:
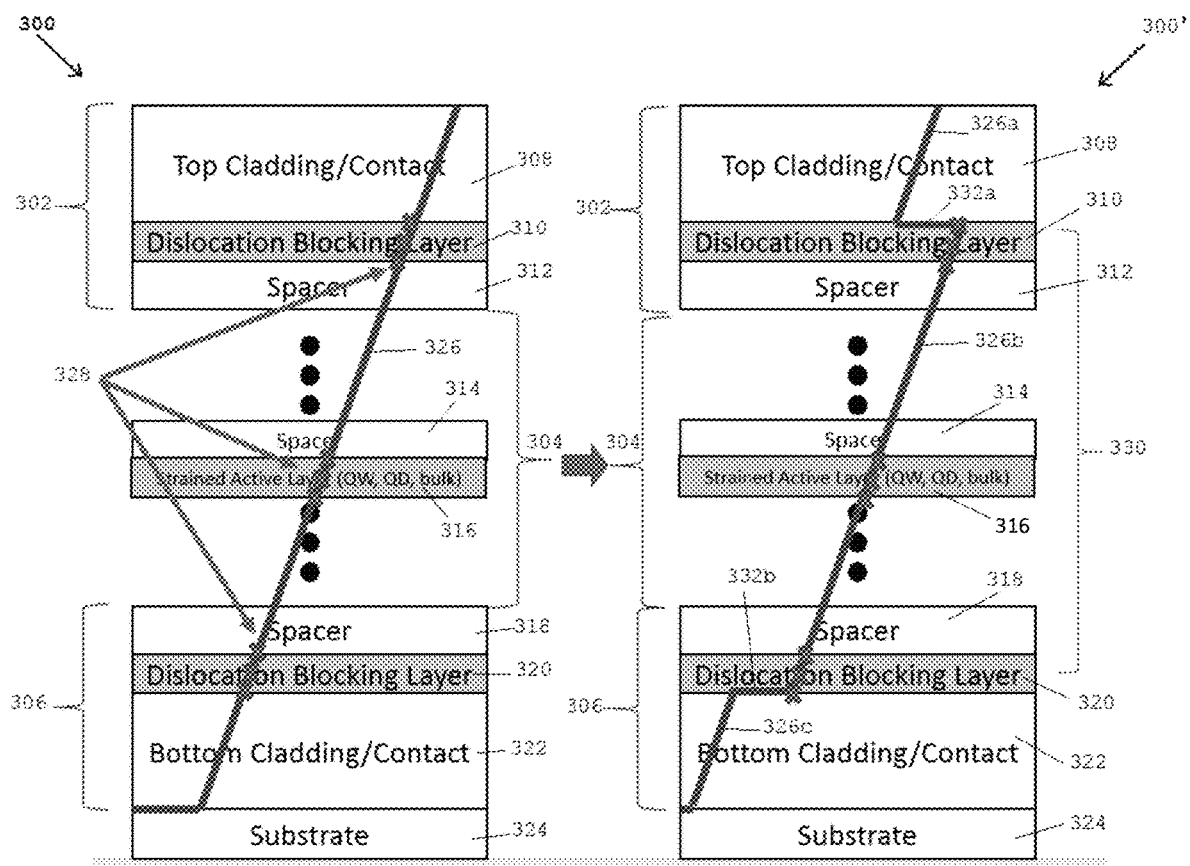
FIGS. 3a and 3b are schematics of the epitaxial structure during growth and cooldown, respectively, utilizing a blocking layer to reduce misfit dislocations in the laser active region according to some embodiments.

Referring to FIGS. 3a and 3b, cross-sectional schematic views are shown of a heteroepitaxial semiconductor 300 during growth (FIG. 3a) and during cooldown (FIG. 3b). In the embodiment shown in FIG. 3a, the heteroepitaxial semiconductor 300 includes a top blocking region 302, an active region 304, a bottom blocking region 306 and a substrate 324. In some embodiments, the top blocking region 302 comprises top cladding/contact layer 308, dislocation blocking layer 310, and spacer layer 312. In some embodiments, the active region 304 includes spacer layer 314 and strained active layer (e.g., QW, QD, bulk) 316. In some embodiments, the bottom blocking region includes spaced layer 318, dislocation blocking layer 320, and bottom cladding/contact layer 322. In the embodiment shown in FIG. 3a, pinning is providing at a number of interfaces 328 within the semiconductor layers based on solid solution hardening, precipitate hardening, growth inhomogeneity, and various other factors. Pinning points 328 prevent the movement of dislocations. As a result, when the heteroepitaxial semiconductor 300 is cooled and the coefficient of thermal expansion (CTE) of the various layers results in the generation and propagation of threading dislocations 326 such as threading dislocation 326a (from above), and threading dislocation 326c (from below), and middle threading dislocation 326b. The pinning points 328 within dislocation blocking layer 310 and dislocation blocking layer 320 result in misfit dislocations 332a, 332b forming within the respective dislocation blocking layers 310 and 320.

In some embodiments, dislocation blocking layer 310 and dislocation blocking layer 320 comprises an InGaAs quantum well (QW) located above InAs quantum dot (QD) layers 304 on silicon and an InGaAs QW located below the InAs quantum dot (QD) layers 304, which are grown in a GaAs lattice constant matrix. The dislocation blocking layer 310 and dislocation blocking layer 320 act to capture the gliding misfit dislocations from reaching the critical quantum dot layers 304. The exact composition and placement of the dislocation blocking layers 310 and 320 are selected to not exceed a critical thickness during growth based on lattice constant mismatch and proximity to the adjacent layer is low enough that the thickness is below that of the critical thickness due to the thermal expansion mismatch with the substrate (or potentially other high CTE mismatch layer within the device). This layer need not be included in the unintentionally doped intrinsic region of the device. In fact, superior performance could be obtained through placing the strained layers in the highly doped cladding if the proximity requirement were satisfied. Outside the intrinsic region, the low minority carrier population will limit parasitic recombination. Such parasitic recombination could lower injection efficiency in lasers and result in recombination enhanced glide or climb of the misfits toward the dot layers during device operation. The strained layer could also be engineered to serve multiple purposes through bandgap engineering. For example: the composition could be altered as desired to provide or avoid barriers to electron or hole transport or an asymmetric quantum confinement could be designed such that no states exist in the well to avoid undesired recombination, amongst other possible designs.

Figure 4A:
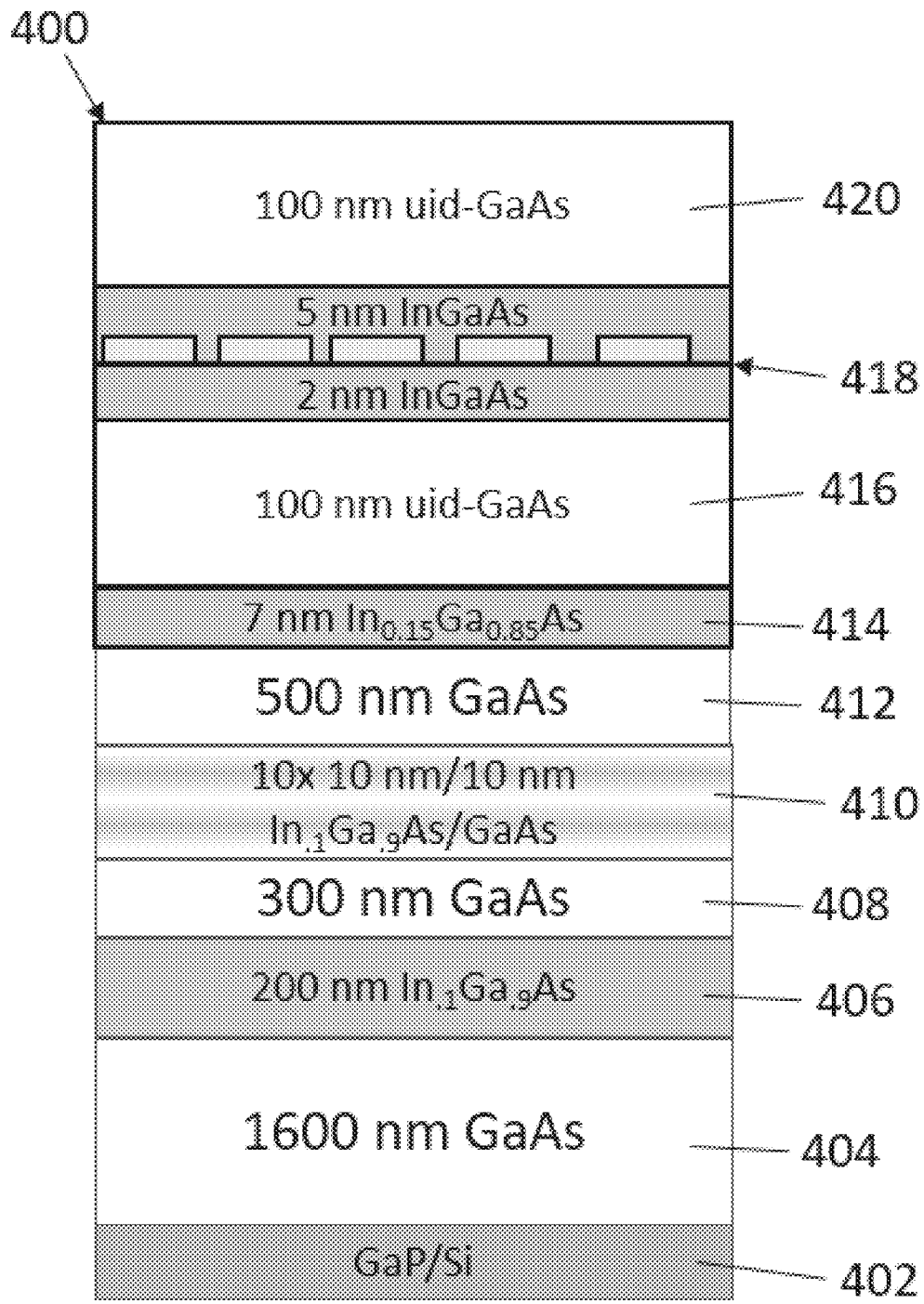
FIG. 4a is a schematic of the epitaxial structure utilizing a dislocation blocking layer according to some embodiments.

FIG. 4a is a schematic of the epitaxial structure utilizing a blocking layer to reduce misfit dislocations in the laser active region according to some embodiments. In this embodiment, epitaxial structure 400 includes a quantum dot active layer 418 comprised of Indium-Gallium-Arsenide (InGaAs) layers 418 on a Gallium-Phosphide (GaP) and/or Silicon (Si) substrate 402. In this embodiment, an Indium-Gallium-Arsenide (InGaAs) blocking layer 414 is utilized to capture misfit locations gliding upward toward the quantum dot active layer 418. A GaAs spacer layer 416 is located between the active layer 418 and the blocking layer 414.

In this embodiment, the composition of dislocation blocking layer 414 is $In_{0.15}Ga_{0.85}As$, and has a thickness of approximately 7 nm. The spacer layer 416 is selected to have a thickness of approximately 100 nm, and the quantum dot layer has a thickness of approximately 7 nm. In other embodiments, the thickness, composition, and proximity of the dislocation blocking layer 414 may be modified. Additional layers include a GaAs layer 404, $In_{0.1}Ga_{0.9}As$ layer 406, GaAs layer 408, $In_{0.1}Ga_{0.9}As$/GaAs layer 410, GaAs layer 412 stacked on top of the Si substrate 402. In some embodiments, a uid-GaAs layer 420 is located adjacent to the active layer 418.

Figures 4B, 4C:
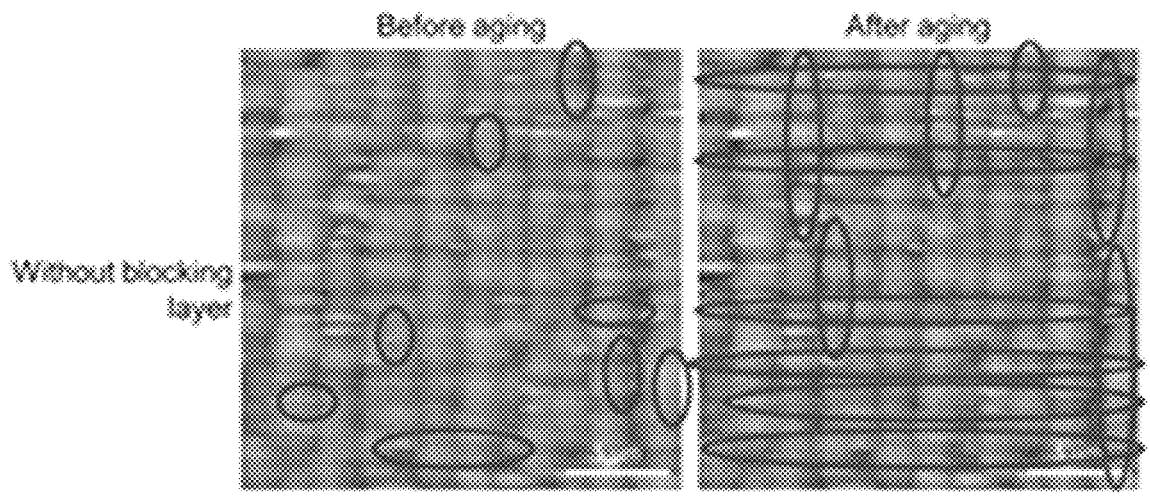
FIGS. 4b-4c are electron channeling contrast image (ECCI) of misfit dislocations in InAs quantum dot (QD) layers on silicon without a blocking layer.
Figures 4D, 4E:
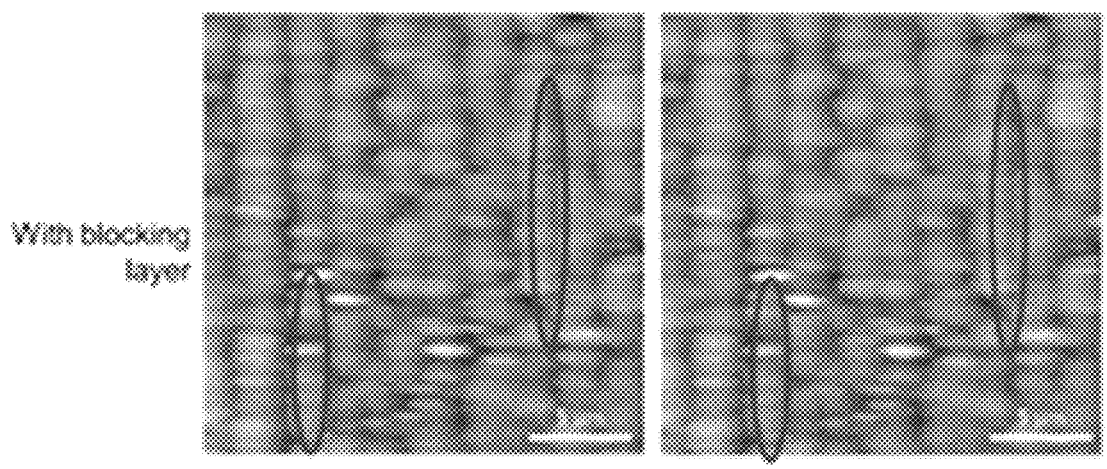
FIGS. 4d-4e are electron channeling contrast image (ECCI) of misfit dislocations in InAs quantum dot (QD) layers on silicon with a blocking layer according to some embodiments.

FIGS. 4b and 4c are electron channeling contrast imaging (ECCI) images of the epitaxial structure shown in FIG. 4a without the presence of dislocation blocking layer 414 before aging and after aging, wherein aging refers to injection of electron-hole pairs. In contrast, FIGS. 4d and 4e are electron channeling contrast imaging (ECCI) images of the epitaxial structure shown in FIG. 4a with the presence of dislocation blocking layer 414 before aging and after aging. As shown in FIGS. 4b and 4c, the sample without the blocking layer 414 showed significant growth in the visible misfit segments as well as the appearance of new segments during electron beam irradiation (aging). In addition, misfit dislocations were illustrated to form by glide in the vicinity of a pinned threading dislocation during aging.

As shown in FIGS. 4d and 4e, the presence of dislocation blocking layer 414 reduces the glides as the existing misfits do not lengthen and no new misfit dislocations appear. That is, FIGS. 4d and 4e indicate that any glide that does occur is captured in the blocking layer and outside of the imaging depth of the ECCI image.

The invention claimed is:

1. An epitaxial structure comprising:
   a semiconductor substrate;
   a dislocation blocking layer fabricated to include a plurality of pinning points;
   one or more active layers;
   a threading dislocation extending through the dislocation blocking layer and the one or more active layers, wherein the threading dislocation is glissile; and
   a misfit dislocation extending along a plane of the dislocation blocking layer, wherein the threading dislocation incident on one of the plurality of pinning points results in the formation of the misfit dislocation within the dislocation blocking layer but not within the one or more active layers through which the threading dislocation extends.

2. The epitaxial structure of claim 1, further including a spacer layer located between the dislocation blocking layer and the one or more active layers.

3. The epitaxial structure of claim 2, wherein a thickness of the dislocation blocking layer is less than a thickness of the spacer layer.

4. The epitaxial structure of claim 3, wherein the spacer layer thickness is approximately 100 nanometers (nm).

5. The epitaxial structure of claim 1, wherein the dislocation blocking layer is characterized by either a compressive strain or a tensile strain.

6. The epitaxial structure of claim 1, wherein the plurality of pinning points associated with the dislocation blocking layer are provided via one or more nanostructure layers fabricated within the dislocation blocking layer.

7. The epitaxial structure of claim 6, wherein the one or more nanostructure layers includes one or more layers of quantum wells and/or one or more layers of quantum dots.

8. The epitaxial structure of claim 1, wherein the plurality of pinning points associated with the dislocation blocking layer are provided via alloy hardening, and/or precipitate hardening of the dislocation blocking layer.

9. The epitaxial structure of claim 1, wherein the dislocation blocking layer comprises a quantum well (QW).

10. The epitaxial structure of claim 9, wherein the dislocation blocking layer comprises InGaAs and/or InAlAs.

11. An epitaxial structure comprising:
    a semiconductor substrate;
    a bottom blocking region;
    one or more active layers;
    a misfit dislocation extending along a plane of the bottom blocking region; and
    one or more threading dislocations extending through the bottom blocking region and the one or more active layers, wherein the bottom blocking region is located between the semiconductor substrate and the one or more active layers and wherein a lattice constant of the semiconductor substrate is different than a lattice constant of the one or more active layers, wherein the bottom blocking region includes a dislocation blocking layer and a spacer layer, wherein the spacer layer is located between the dislocation blocking layer and the one or more active layers, wherein the dislocation blocking layer includes pinning points configured to pin the one or more threading dislocations extending through the bottom blocking region and the one or more active layers, wherein the misfit dislocation is formed where the threading dislocation intersects one of the pinning points within the dislocation blocking layer, wherein formation of the misfit dislocation within the dislocation blocking layer prevents misfit dislocation formation within the one or more active layers.

12. The epitaxial structure of claim 11, further including:
    an upper blocking region, wherein the one or more active layers are located between the lower blocking region and the upper blocking region; and
    a second misfit dislocation extending along a plane of the upper blocking layer.

13. The epitaxial structure of claim 11, wherein the dislocation blocking layer comprises a quantum well (QW).

14. The epitaxial structure of claim 13, wherein the dislocation blocking layer comprises InGaAs and/or InAlAs.

15. An epitaxial structure comprising:
    a semiconductor substrate;
    one or more active layers;
    a first dislocation blocking layer comprising a first plurality of pinning points, the first dislocation blocking layer located below the one or more active layers;
    a second dislocation blocking layer comprising a second plurality of pinning points, the second dislocation blocking layer located above the one or more active layers; and
    a threading dislocation extending through the one or more active layers and the first and second dislocation blocking layer; and
    a first misfit dislocation formed within a plane of the first dislocation blocking layer at an intersection of the threading dislocation and one of the first plurality of pinning points; and
    a second misfit dislocation formed within a plane of the second dislocation blocking layer at an intersection of the threading dislocation and one of the second plurality of pinning points.

16. The epitaxial structure of claim 15, wherein the first dislocation blocking layer and/or second dislocation blocking layer comprises a quantum well (QW).

17. The epitaxial structure of claim 16, wherein the first dislocation blocking layer and/or the second dislocation blocking layer comprises InGaAs and/or InAlAs.

* * * * *